United States Patent [19]
Iwamatsu et al.

[11] Patent Number: 5,910,672
[45] Date of Patent: Jun. 8, 1999

[54] SEMICONDUCTOR DEVICE AND METHOD OF MANUFACTURING THE SAME

[75] Inventors: Toshiaki Iwamatsu; Takashi Ipposhi, both of Tokyo, Japan

[73] Assignee: Mitsubishi Denki Kabushiki Kaisha, Tokyo, Japan

[21] Appl. No.: 08/888,898

[22] Filed: Jul. 7, 1997

[30] Foreign Application Priority Data

Feb. 26, 1997 [JP] Japan ..................................... 9-042250

[51] Int. Cl.$^6$ ................................................. H01L 21/76
[52] U.S. Cl. .......................... 257/347; 257/219; 257/220; 257/221; 257/224; 257/285
[58] Field of Search ................................ 257/59, 72, 219, 257/224, 220, 221, 345, 349, 347, 285

[56] References Cited

U.S. PATENT DOCUMENTS

| | | | |
|---|---|---|---|
| 4,772,927 | 9/1988 | Saito et al. | |
| 5,266,816 | 11/1993 | Seto et al. | |
| 5,468,657 | 11/1995 | Hsu | 257/766 |
| 5,581,092 | 12/1996 | Takemura | 257/66 |

FOREIGN PATENT DOCUMENTS

| | | |
|---|---|---|
| 3-138983 | 6/1991 | Japan . |
| 7-176743 | 7/1995 | Japan . |
| PCT/JP96/01648 | 6/1996 | Japan . |

OTHER PUBLICATIONS

Yamaguchi, Y., et al., "Improvement of Leakage–Current–Related Yield of SOI MOSFET's Using Nitrogen Ion–Implantation to the Source and Drain Regions", *Proceedings 1996 IEEE International SOI Conference*, Oct. 1996, pp. 168–169.

Furukawa, A., et al., "Channel Engineering in Sub–quarter–micron MOSFETs Using Nitrogen Implantation for Low Voltage Operation", *1996 Symposium on VLSI Technology Digest Of Technical Papers*, 1996, pp. 62–63.

*Primary Examiner*—Tom Thomas
*Assistant Examiner*—Fetsum Abraham
*Attorney, Agent, or Firm*—Oblon, Spivak, McClelland, Maier & Neustadt, P.C.

[57] ABSTRACT

This invention provides a semiconductor device with a SOI structure and a method of manufacturing the same, preventing deterioration in and making improvement in device characteristics. Nitrogen ion implantation into NMOS and PMOS regions (NR, PR) with resists (22b) and (22c) as masks, respectively, introduces nitrogen ions into channel doped layers (31). The subsequent thermal treatment provides a structure with the channel doped layers (31) containing nitrogen having a prescribed concentration distribution in the depth direction.

6 Claims, 10 Drawing Sheets

(BACKGROUND ART)

SEMICONDUCTOR DEVICE AND METHOD OF MANUFACTURING THE SAME

BACKGROUND OF THE INVENTION

1. Field of the Invention

This invention is directed to a semiconductor device and a method of manufacturing the same, especially to a semiconductor device with a SOI (silicon-on-insulator) structure and its manufacturing method.

2. Description of the Background Art

Figure 23:
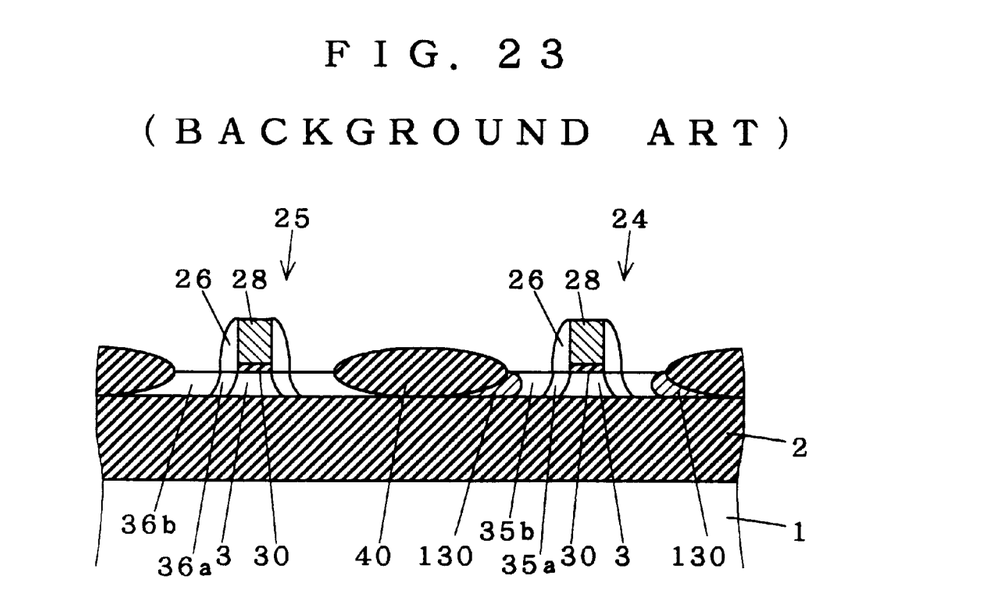
FIG. 23 is a sectional view showing a structure of a SOIMOS transistor.

FIG. 23 is a sectional view showing NMOS and PMOS transistors 24, 25 formed on a SOI substrate, as one of examples of the semiconductor device with the SOI structure.

With reference to FIG. 23, a buried oxide film 2 is formed on the main surface of a silicon substrate 1, and a single-crystal silicon layer 3 (hereinafter referred to as a SOI layer) is formed on the buried oxide film 2. With the SOI layer as a substrate, the NMOS and the PMOS transistors 24, 25 are formed thereon.

The NMOS transistor 24 includes a pair of source/drain layers 35b independently formed parallel to each other at the surface of the SOI layer 3, and a pair of lightly doped drain layers 35a (hereinafter referred to as LDD layers) formed adjacent to the facing edges of the source/drain layers 35b. A gate oxide film 30 is formed on the SOI layer 3, and a gate electrode 28 is formed on the gate oxide film 30. Further, sidewall oxide films 26 are formed at the side surfaces of the gate oxide film 30 and the gate electrode 28.

The PMOS transistor 25 includes a pair of source/drain layers 36b independently formed parallel to each other at the surface of the SOI layer 3, and a pair of LDD layers 36a formed adjacent to the facing edges of the source/drain layers 36b. The gate oxide film 30 is formed on the SOI layer 3, and the gate electrode 28 is formed on the gate oxide film 30. Further, the sidewall oxide films 26 are formed at the side surfaces of the gate oxide film 30 and the gate electrode 28.

The NMOS and the PMOS transistors 24, 25 are electrically isolated by an isolation oxide film 40 formed so as to reach to the buried oxide film 2 from the surface of the SOI layer 3. The isolation oxide film 40 isolates the NMOS and the PMOS transistors 24, 25 from other elements as well.

FIG. 23 also shows that high-concentration impurity regions 130 are formed in contact portions between the isolation oxide film 40 and the SOI layer 3 on which the NMOS transistor 24 is to be formed.

As described above, the NMOS and the PMOS transistors 24, 25 formed on the SOI substrate have structures with the SOI layer 3, which is to be a channel, held between the gate oxide film 30 and the buried oxide film 2. Thus, the SOI layer 3 is inferior in crystalline to a bulk silicon substrate, and further is formed thin as is evident from FIG. 23.

Further, into such SOI layer 3, impurity ions are generally implanted in a manufacturing processes, such as channel implantation and source/drain implantation, of the NMOS and the PMOS transistors 24, 25. This gives damage to the SOI layer 3 and causes further deterioration in crystalline. Thus, a transistor formed on the SOI substrate is inferior in transistor characteristics to that formed on the bulk silicon substrate.

SUMMARY OF THE INVENTION

A first aspect of the present invention is directed to a semiconductor device formed on a SOI substrate in which a buried oxide film and a SOI layer are stacked on a silicon substrate. The semiconductor device comprises: a first semiconductor region of a first conductivity type formed in a predetermined position of the SOI layer, ranging from a surface of the SOI layer to a surface of the buried oxide film; a pair of second semiconductor regions of a second conductivity type independently and selectively formed in the surface of the SOI layer so as to sandwich the first semiconductor region; a gate oxide film formed in an upper portion of the first semiconductor region; and a gate electrode formed on the gate oxide film, wherein the first semiconductor region contains nitrogen introduced so as to have a predetermined concentration distribution in a depth direction thereof, the predetermined concentration distribution having: a first peak portion protruding with a first concentration, in the vicinity of an interface between the first semiconductor region and the buried oxide film; and a second peak portion protruding with a second concentration, in the vicinity of an interface between the first semiconductor region and the gate oxide film.

Preferably, according to a second aspect of the present invention, the predetermined concentration distribution has a plane portion of near uniformity with a third concentration lower than the first and the second concentrations, in a region held between the first and the second peak portions.

Preferably, according to a third aspect of the present invention, the first concentration ranges from $1\times10^{18}$ to $1\times10^{19}/cm^3$; the second concentration ranges from $1\times10^{19}$ to $1\times10^{20}/cm^3$; and the third concentration ranges from $1\times10^{16}$ to $1\times10^{17}/cm^3$.

Preferably, according to a fourth aspect of the present invention, the predetermined concentration distribution has a third peak portion protruding with a third concentration at least lower than the second concentration, near a center of a region held between the first and the second peak portions.

Preferably, according to a fifth aspect of the present invention, the first concentration ranges from $1\times10^{18}$ to $1\times10^{19}/cm^3$; the second concentration ranges from $1\times10^{19}$ to $1\times10^{20}/cm^3$; and the third concentration ranges from $1\times10^{18}$ to $5\times10^{19}/cm^3$.

Preferably, according to a sixth aspect of the present invention, the second semiconductor region contains nitrogen introduced so as to have nearly the same concentration with the second concentration.

A seventh aspect of the present invention is directed to a method of manufacturing a semiconductor device formed on a SOI substrate in which a buried oxide film and a SOI layer are stacked on a silicon substrate. The method of manufacturing the semiconductor device comprises the steps of: (a) preparing the SOI substrate; (b) defining a device forming region for forming the semiconductor device by electrically isolating a predetermined region of the SOI layer from other regions; (c) forming a first semiconductor region of a first conductivity type by ion-implanting an impurity of a first conductivity type and nitrogen into the device forming region; (d) giving heat treatment to the first semiconductor region in such a condition that the nitrogen gets a predetermined concentration distribution in a depth direction of the first semiconductor region; (e) forming a gate oxide film on the first semiconductor region; (f) forming a gate electrode on the gate oxide film; and (g) forming second semiconductor regions of a second conductivity type by ion-implanting an impurity of a second conductivity type and nitrogen into the first semiconductor region with the gate electrode as a mask, wherein the predetermined concentration distribution has: a first peak portion protruding with a first concentration, in the vicinity of an interface between the first semiconductor region and the buried oxide film; and a second peak portion protruding with a second 6 concentration, in the vicinity of an interface between the first semiconductor region and the gate oxide film.

Preferably, according to an eighth aspect of the present invention, the step (c) comprises a step of ion-implanting the nitrogen after ion-implanting the impurity of a first conductivity type.

Preferably, according to a ninth aspect of the present invention, the step (c) comprises a step of ion-implanting the impurity of a first conductivity type after ion-implanting the nitrogen.

Preferably, according to a tenth aspect of the present invention, the nitrogen is implanted at a dose of $0.1 \times 10^{12}$ to $100 \times 10^{12}/cm^2$ at an energy of 20 to 35 keV.

Preferably, according to an eleventh aspect of the present invention, the step (d) comprises a step of performing annealing in nitrogen atmosphere for 5 to 30 minutes at a temperature of 800 to 900° C.

Preferably, according to a twelfth aspect of the present invention, the step (e) comprises a step of forming the gate oxide film by thermal oxidation; and the heat treatment in the step (d) may also serve as the step of forming the oxide film by thermal oxidation in the step (e).

Preferably, according to a thirteenth aspect of the present invention, the step (g) comprises the steps of: (g-1) ion-implanting the impurity of a second conductivity type into the first semiconductor region with the gate electrode as a mask; and (g-2) forming an oxide film on the gate oxide film and the gate electrode, and then ion-implanting the nitrogen through the oxide film.

Preferably, according to a fourteenth aspect of the present invention, the step (g-2) comprises a step of ion-implanting the nitrogen at a dose of $0.1 \times 10^{12}$ to $10 \times 10^{12}/cm^2$ at an energy of 5 to 20 kev.

Preferably, according to a fifteenth aspect of the present invention, the step (f) comprises the steps of: (f-1) forming a polysilicon layer on the gate oxide film; and (f-2) forming the gate electrode by selectively removing the polysilicon layer after ion-implanting nitrogen into the polysilicon layer.

Preferably, according to a sixteenth aspect of the present invention, the step (f-2) comprises a step of implanting the nitrogen at a dose of $3 \times 10^{14}$ to $12 \times 10^{14}/cm^2$ at an energy of 5 to 30 keV.

In the semiconductor device of the first aspect of the present invention, the first semiconductor region contain nitrogen introduced so as to have the concentration distribution in the depth direction, the concentration distribution having the first peak portion protruding with the first concentration, in the vicinity of the interface between the first semiconductor region and the buried oxide film; and the second peak portion protruding with the second concentration, in the vicinity of the interface between the first semiconductor region and the gate oxide film. Thus, deterioration in transistor characteristics can be prevented by combining nitrogen with dangling bonds existing a lot in the interface between the first semiconductor region and the buried oxide film, while transistor characteristics can be improved by combining nitrogen with dangling bonds existing a lot in the interface between the first semiconductor region and the gate oxide film.

In the semiconductor device of the second aspect of the present invention, nitrogen is almost uniformly distributed with the third concentration lower than the first and the second concentration in a region between the first and the second peak portions. The nitrogen is trapped in the crystal defects in the SOI layer, preventing an impurity from being trapped in the crystal defects. This prevents variations in concentration of the impurity active in the SOI layer. Thus, deterioration in transistor characteristics caused by existence of the crystal defects can be prevented, and further similar transistor characteristics to the bulk transistor become available in the SOI transistor.

In the semiconductor device of the third aspect of the present invention, optimum value in the concentration distribution of nitrogen achieves a practical semiconductor device preventing deterioration in and making improvement in transistor characteristics.

In the semiconductor device of the fourth aspect of the present invention, nitrogen concentration distribution has the third peak portion protruding with the third concentration lower than the first and the second concentration, in a portion between the first and the second peak portions. The nitrogen is trapped in the crystal defects in the SOI layer, preventing an impurity from being trapped in the crystal defects. This prevents vacations in concentration of the impurity active in the SOI layer. Thus, deterioration in transistor characteristics caused by existence of the crystal defects can be prevented, and further similar transistor characteristics to the bulk transistor become available in the SOI transistor.

In the semiconductor device of the fifth aspect of the present invention, optimum value in the concentration distribution of nitrogen achieves a practical semiconductor device preventing deterioration in and making improvement in transistor characteristics.

In the semiconductor device of the sixth aspect of the present invention, nitrogen of nearly the same concentration with that in the second peak portion is introduced in the second semiconductor regions (i.e., source/drain layers). Thus, impurity concentration in the second semiconductor regions becomes higher than that in the first semiconductor region, which makes it possible to cope with a lot of crystal defects due to impurity implantation. This achieves a semiconductor device which prevents deterioration in and makes improvement in transistor characteristics.

The seventh aspect of the present invention provides the method of manufacturing a semiconductor device desirable for the semiconductor device of the first aspect of the present invention.

In the method of manufacturing the semiconductor device of the eighth aspect of the present invention, nitrogen is trapped in the crystal defects with subsequent thermal treatment by implanting nitrogen after implanting the impurity of a first conductivity type.

In the method of manufacturing the semiconductor device of the ninth aspect of the present invention, nitrogen is trapped in the crystal defects with subsequent thermal treatment by implanting the impurity of a first conductivity type after implanting nitrogen ions.

In the method of manufacturing the semiconductor device of the tenth aspect of the present invention, it is possible to obtain optimum conditions for implanting nitrogen ions into the first semiconductor regions.

In the method of manufacturing the semiconductor device of the eleventh aspect of the present invention, it is possible to obtain optimum conditions for diffusing nitrogen ions implanted into the first semiconductor region so that the nitrogen ions have a prescribed concentration distribution in the depth direction.

In the method of manufacturing the semiconductor device of the twelfth aspect of the present invention, the step of diffusing nitrogen ions implanted into the first semiconductor regions serves also as that of forming the gate oxide films, which suppresses increase in the number of the steps in the preferred embodiments of the present invention.

In the method of manufacturing the semiconductor device of the thirteenth aspect of the present invention, nitrogen is trapped in the crystal defects due to impurity implantation by implanting nitrogen in forming the second semiconductor region as well, which prevents deterioration in transistor characteristics. Further, nitrogen ion implantation performed through the oxide film in this case prevents deterioration in crystalline of the SOI layer caused by the nitrogen ion implantation.

In the method of manufacturing the semiconductor deceive of the fourteenth aspect of the present invention, it is possible to obtain optimum conditions for implanting nitrogen ions into the second semiconductor regions.

In the method of manufacturing the semiconductor device of the fifteenth aspect of the present invention, nitrogen ion implantation into the gate electrodes introduces nitrogen to the gate oxide films as well, thereby increasing nitrogen concentration in the vicinity of the interface between the first semiconductor regions and the gate oxide films.

In the method of manufacturing the semiconductor device of the sixteenth aspect of the present invention, it is possible to obtain optimum conditions for implanting nitrogen ions into the gate electrodes.

This invention provides a semiconductor device with the SOI structure which prevents deterioration in and makes improvement in device characteristics, and its manufacturing method.

These and other objects, features, aspects and advantages of the present invention will become more apparent from the following detailed description of the present invention when taken in conjunction with the accompanying drawings.

DESCRIPTION OF THE PREFERRED EMBODIMENTS

<1. Manufacturing Process>

A process of forming a MOS transistor on a SOI substrate in accordance with the present invention is now explained with reference to FIGS. 1 to 17.

FIGS. 1 to 17 are sectional views showing in sequence the process of forming NMOS and PMOS transistors on the SOI substrate.

Figure 1:
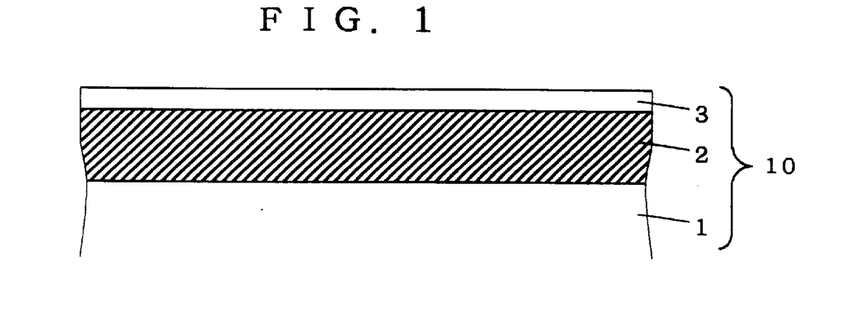
FIGS. 1 to 17 are sectional views illustrating a manufacturing process of a semiconductor device in accordance with preferred embodiments of the present invention.

First, a SOI substrate 10 as shown in FIG. 1 is prepared. The SOI substrate 10 has a buried oxide film 2 and a single-crystal silicon layer 3 (hereinafter referred to as a SOI layer) stacked one above the other on a silicon substrate 1. A method of manufacturing the SOI substrate 10 may be a SIMOX (separation by implanted oxygen) method or a bonding method.

Figure 2:
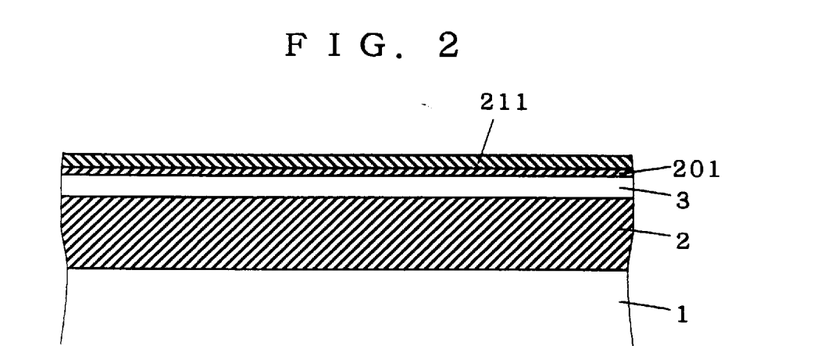

With reference to FIG. 2, an oxide film 201 with a thickness of 100 to 300 Å is, for example, formed on the SOI layer 3 at temperature near 800° C. by a CVD (chemical vapor deposition) method. The oxide film 201 may be formed by thermal oxidation at temperature near 800° C. Then, an nitride film 211 with a thickness of 1000 to 2000 Å is formed on the oxide film 201 at temperature near 700° C.

The nitride film 211 is selectively removed so as to leave a nitride film 21 only on a region to be active in the SOI layer 3 by means of, for example, dry etching. Then, with reference to FIG. 3, a resist 22a is formed on a region PR (hereinafter referred to as a PMOS region) where the PMOS transistor is to be formed. With the resist 22a as a mask, high-concentration impurity regions ($P^+$) 13 are formed in a region NR (hereinafter referred to as an NMOS region) where the NMOS transistor is to be formed, for example, by implanting boron ions from a diagonal direction at a dose of $3 \times 10^{13}$ to $8 \times 10^{13}/cm^2$ at an energy of 20 to 35 keV. The implantation is performed at an angle of about 45 degree with rotation of the SOI substrate 10.

Figure 3:
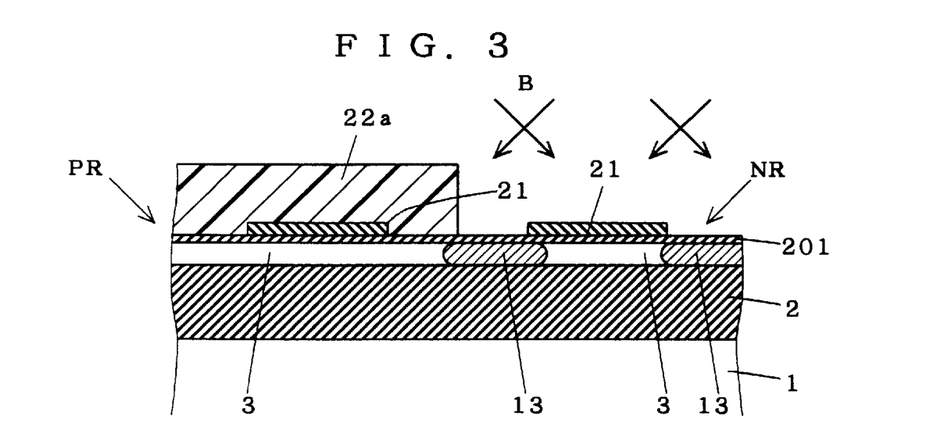

Implanting boron ions from a diagonal direction with rotation of the SOI substrate 10, the high-concentration impurity regions 13 is also formed in the SOI layer 3 under the nitrogen film 21 or the resist 22a. This construction rises a threshold voltage of a parasitic transistor formed in a portion to be the edge of the SOI layer 3, thereby preventing activation of the parasitic transistor.

Further, annealing is performed for about 2 to 5 seconds at a temperature of 750 to 950° C. after the ion implantation shown in FIG. 3. This recovers crystalline of the SOI layer 3 damaged by the ion implantation.

Figure 4:
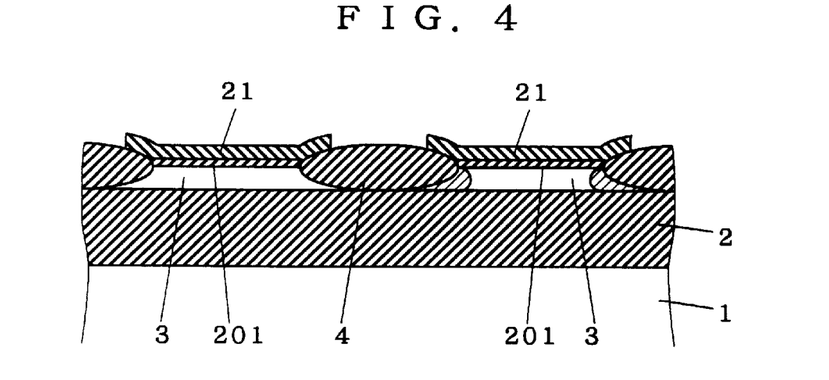
Figure 5:
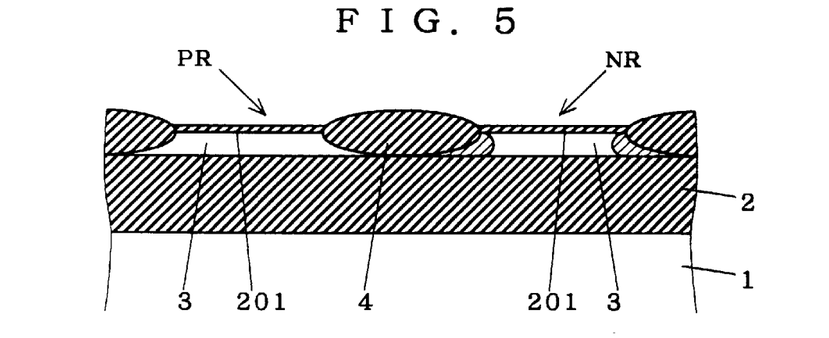

Next, the resist 22a is removed, and, as shown in FIG. 4, an isolation oxide film 4 is selectively formed by LOCOS oxidation with the nitride film 21 as a mask to provide an active region in the SOI layer 3. Then, the PMOS and the NMOS regions PR, NR, which are electrically isolated from each other by the buried oxide film 2 and the isolation oxide film 4, are formed by removing the nitride films 21 with thermal phosphoric acid.

Figure 6:
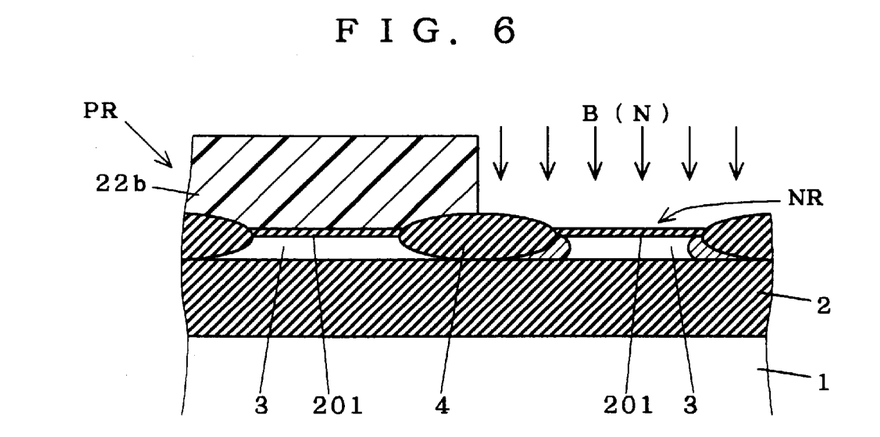

Next, with reference to FIG. 6, a resist 22b is formed on the PMOS region PR. With the resist 22b as a mask, impurity ions are implanted in the NMOS region NR. This implantation makes the SOI layer 3 in the NMOS region NR, of a channel doped layer 31 (first semiconductor region).

In this ion implantation, boron ions (B) are, for example, implanted at a dose of $3 \times 10^{12}$ to $8 \times 10^{12}/cm^2$ at an energy of 20 to 35 keV.

After that, with the resist 22b as a mask, nitrogen ions are implanted into the NMOS region NR at a dose of $0.1 \times 10^{12}$ to $100 \times 10^{12}/cm^2$ at an energy of 20 to 35 keV.

Figure 7:
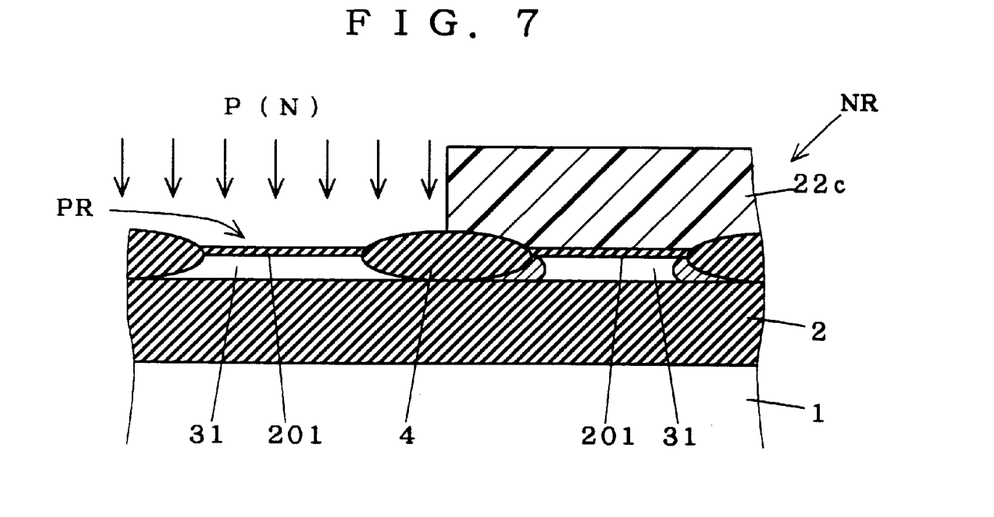

Then, the resist 22b is removed, and a resist 22c is formed on the NMOS region NR as shown in FIG. 7. With the resist 22b as a mask, impurity ions are implanted into the PMOS region PR. This implantation makes the SOI layer 3 in the PMOS region, of the channel doped layer 31.

In this ion implantation, phosphorous ions (P) are, for example, implanted at a dose of $3\times10^{12}$ to $8\times10^{12}/cm^2$ at an energy of 20 to 60 keV.

After that, with the resist 22c as a mask, nitrogen ions (N) are implanted into the PMOS region PR at a dose of $0.1\times10^{12}$ to $100\times10^{12}/cm^2$ at an energy of 20 to 35 keV.

Next, the SOI substrate with the NMOS and the PMOS regions NR, PR where nitrogen ions are implanted is exposed to nitrogen atmosphere, and annealed for about 5 to 30 minutes at temperature near 820° C.

<1—1. First Effect of Nitrogen Ion Implantation>

The following description explains the reason for implanting nitrogen ions into the PMOS and the NMOS regions PR, NR.

In general, crystal defects are distributed over the SOI layer in density of $1\times10^2$ to $1\times10^7/cm^2$. If impurity ions are implanted into such SOI layer, some of them may be diffused and be trapped in the crystal defects by subsequent heat treatment. The more crystal defects exist, the more active impurity ions are reduced in the vicinity of the crystal defects, which results in deterioration in transistor characteristics. This would not occur in a transistor formed in a bulk silicon layer (hereinafter referred to as a bulk transistor) which is superior in crystalline or in a transistor formed in a polysilicon layer (e.g., thin film transistor).

On the other hand, if nitrogen ions are simultaneously implanted with impurity ions, nitrogen ions are trapped instead of the impurity ions. Thus, effective crystal defects (crystal defects which can trap atoms) are decreased, thereby preventing reduction in active impurity ions in the vicinity of the crystal defects. That is, deterioration in transistor characteristics caused by the crystal defects can be prevented and similar transistor characteristics to the bulk transistor can be obtained in the SOI transistor.

Further, nitrogen has the property of substitutional diffusing like boron with diffusion coefficient larger than boron. Thus, nitrogen might be trapped in the crystal defects prior to boron. The diffusion in a different form, however, would not affect the effect as described above.

Furthermore, though density of the crystal defects differs among each SOI substrate, reduction in effective crystal defects as described above avoids a possibility that each SOI substrate may have different impurity concentration. Thus, variations in transistor characteristics between lots and between batches of the SOI substrate can be reduced in mass production of semiconductor devices.

When a dose of nitrogen ion implantation exceeds $100\times10^{12}/cm^2$, for example, around $1\times10^{15}/cm^2$, the SOI layer is damaged by nitrogen ions. In this case, nitrogen ion implantation causes deterioration in transistor characteristics rather than improving its characteristics.

Further, viewed in the fact that nitrogen ions are used to be trapped in the crystal defects, nitrogen ion implantation may be performed before impurity ion implantation.

Moreover, though nitrogen ions are separately implanted into the NMOS and the PMOS regions NR, PR in the process shown in FIGS. 6 and 7, this may be simultaneously performed either after or before impurity ion implantation into the NMOS and the PMOS regions NR, PR. This reduces the number of switching ions between nitrogen and impurity, thereby reducing loss of time in switching of ion-species and improving production efficiency.

Further, an implant energy of boron and phosphorous ions, as described above with FIGS. 6 and 7, is set up so that the center of the SOI layer 3 in the depth direction may be the peak of impurity distribution, when the SOI layer 3 is about 1000 angstrom in thickness. Thus, the implant energy would differ depending on species of impurities or a thickness of the SOI layer 3.

<1-2. Second Effect of Nitrogen Ion Implantation>

The following description is about another effect of nitrogen ion implantation.

Figure 17:
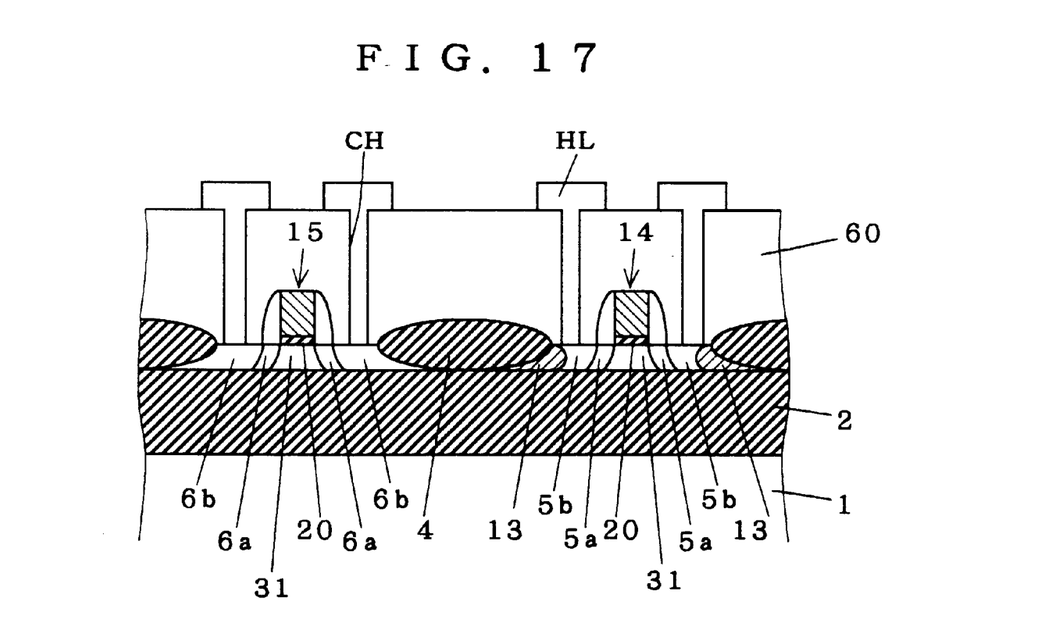

As will be described later with a completed structure shown in FIG. 17, the NMOS and the PMOS transistors 14, 15 have the structure with the channel doped layer 31, which is to be a channel, held between the gate oxide film 20 and the buried oxide film 2. In general, there are a lot of dangling bonds caused by crystal defects in an interface between a silicon layer and an oxide film, which is one of the causes of deterioration in transistor characteristics. The SOI transistor especially includes two interfaces between the silicon layer and the oxide film: the interface between the channel doped layer 31 and the buried oxide film 2 (hereinafter referred to as a first interface); and the interface between the channel doped layer 31 and the gate oxide film 20 (hereinafter referred to as a second interface).

If the first interface is in a bad condition (i.e., a lot of dangling bonds), it is difficult to obtain a prescribed transistor characteristics, and only a transistor inferior in transistor characteristics to the bulk transistor is available. Since the condition of the first interface is worse than that of the second interface, it is important to improve the condition of the first interface in order to prevent deterioration in transistor characteristics.

When the second interface is in a bad condition (i.e., a lot of dangling bonds), improvement in transistor characteristics including hot carrier resistance is not attainable.

Inactivation of dangling bonds by combining them with implanted nitrogen ions, however, would prevent deterioration in and make improvement in transistor characteristics.

In order to inactivate dangling bonds, it becomes important to segregate nitrogen ions in the vicinity of the first and the second interfaces besides diffusing and trapping them in crystal defects in the channel doped layer 3 as described in the foregoing. The annealing conditions previously described (i.e., nitrogen atmosphere, temperature of about 820° C., and time of 5 to 30 minutes) is obtained by experiments conducted by the inventors, meeting the requirement of the diffusing conditions of nitrogen ions.

The annealing temperature may be near 800 to 900° C. and the annealing time may be more than 30 minutes. Too high annealing temperature or too long annealing time, however, causes excessive diffusion of nitrogen ions, preventing segregation of nitrogen ions in the vicinity of the first and the second interfaces.

Now, getting back to the manufacturing process continued from FIG. 7, the resist 22c and the gate oxide film 201 are removed after the process shown in FIG. 7, and more gate oxidation is performed to form a gate oxide film 20 on the surface of the channel doped layer 31 (not shown).

Figure 8:
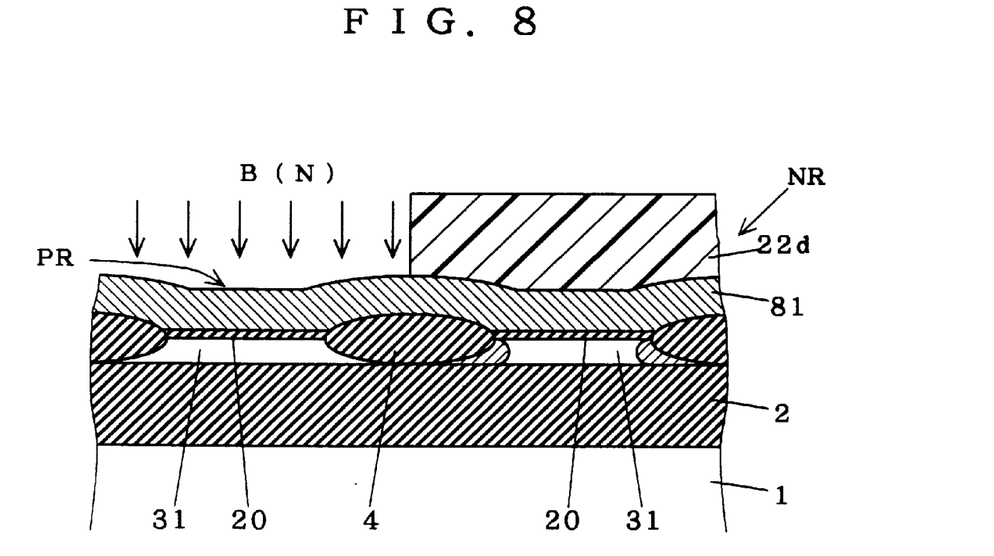

Next, with reference to FIG. 8, a gate polysilicon layer 81 to be gate electrodes is formed on the NMOS and the PMOS regions NR, PR, for example, with a thickness of 1000 to 3000 angstrom by a CVD method. Then, a resist 22d is formed on the NMOS region NR to implant impurity ions into the polysilicon layer 81 on the PMOS region PR. In this ion implantation, boron ions are, for example, implanted at a dose of $3\times10^{15}$ to $8\times10^{15}/cm^2$ at an energy of 5 to 20 keV. After that, with the resist 22d as a mask, nitrogen ions are implanted in the polysilicon layer 81 on the PMOS region PR at a dose of $3 \times 10^{14}$ to $12 \times 10^{14}/\text{cm}^2$ at an energy of 5 to 30 keV.

Figure 9:
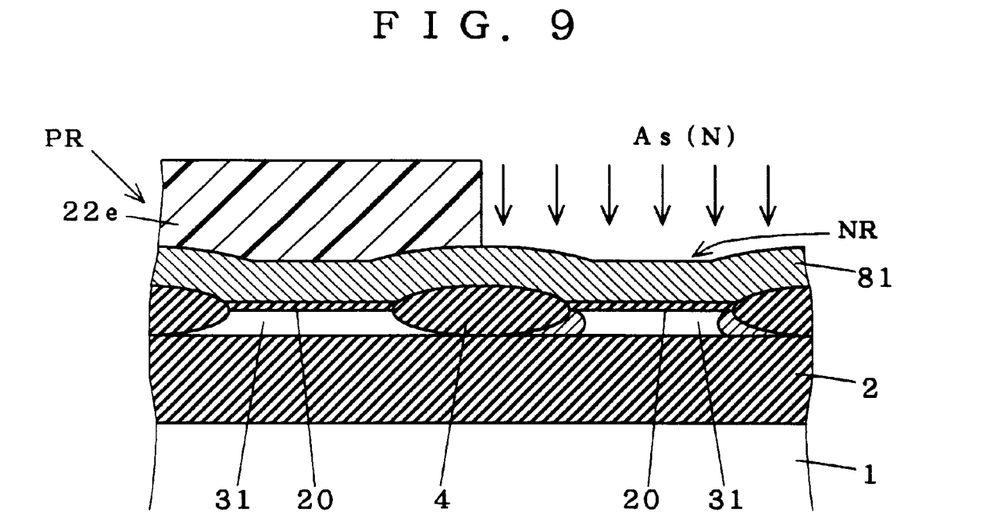

After the resist 22d is removed, a resist 22e is formed on the PMOS region PR to implant impurity ions into the polysilicon layer 81 on the NMOS region NR, as shown in FIG. 9. In this ion implantation, arsenic ions (AS) are, for example, implanted at a dose of $3 \times 10^{15}$ to $8 \times 10^{15}/\text{cm}^2$ at an energy of 5 to 20 keV.

Then, with the resist 22e as a mask, nitrogen ions are implanted into the NMOS region NR at a dose of $3 \times 10^{14}$ to $12 \times 10^{14}/\text{cm}^2$ at an energy of 5 to 30 keV.

<1-3. Effect of Nitrogen Implantation into Gate Electrode>

The impurity ion implantation into the polysilicon layer 81 is a necessary measure to control work functions in using the polysilicon layer 81 as gate electrodes. Further, the reason why each implant energy of boron ions and arsenic ions is the same is that those ions are implanted only into the top surface of the polysilicon layer 81. The impurity ions are diffused by subsequent heat treatment and are almost uniformly distributed in the polysilicon layer 81.

Moreover, nitrogen ion implantation into the polysilicon layer 81 aims to inactivate dangling bonds in the interface (second interface) between the oxide film 20 and the channel doped layer 31 by segregating nitrogen in the vicinity of the gate oxide film 20. Though the nitrogen ion implantation into the SOI layer as shown in FIGS. 6 and 7 and the subsequent annealing process have already inactivated most of the dangling bonds in the second interface, further nitrogen ion implantation into the polysilicon layer 81 makes almost all dangling bonds in the second interface inactive, thereby bringing about further improvements in transistor characteristics.

Though a p-type impurity (boron) is introduced in the polysilicon layer 81 on the PMOS region PR, existence of nitrogen ions prevents diffusion of the p-type impurity in the channel doped layer 31 through the gate oxide film 20.

Now, getting back to the manufacturing process continued from FIG. 9, after the process shown in FIG. 9, the polysilicon layer 81 is selectively removed to form a gate electrode 8a in a prescribed position on the oxide film 20 of the NMOS region NR, and a gate electrode 8b in a prescribed position on the oxide film 20 of the PMOS region PR.

Figure 10:
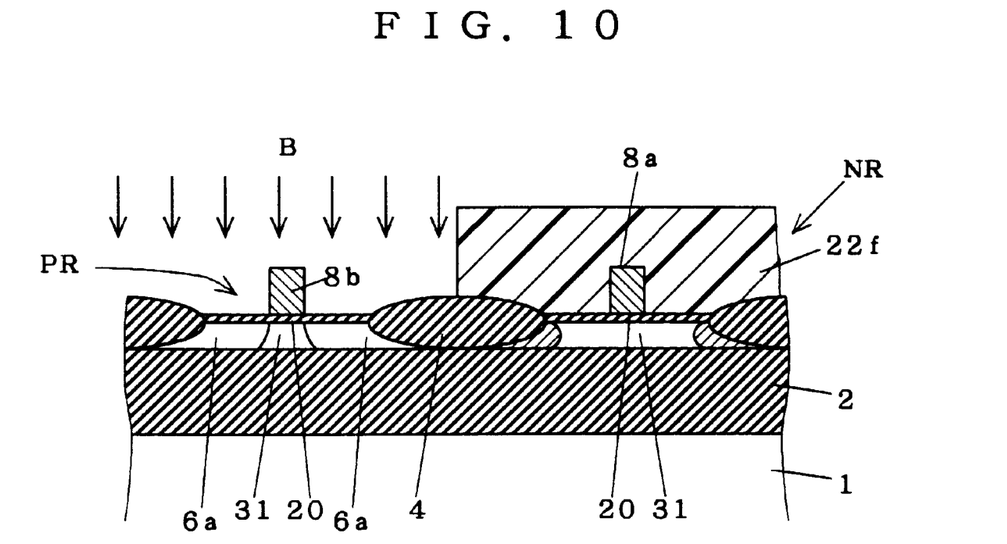

Then, a resist 22f is formed on the NMOS region NR as shown in FIG. 10. With the resist 22f and the gate electrode 8b as masks, ion implantation into the PMOS region PR is performed to form lightly doped drain layers 6a (hereinafter referred to as LDD layers) in the channel doped layer 31.

In this ion implantation, boron ions are, for example, implanted at a dose of $0.1 \times 10^{12}$ to $10 \times 10^{12}/\text{cm}^2$ at an energy of 5 to 20 keV.

Figure 11:
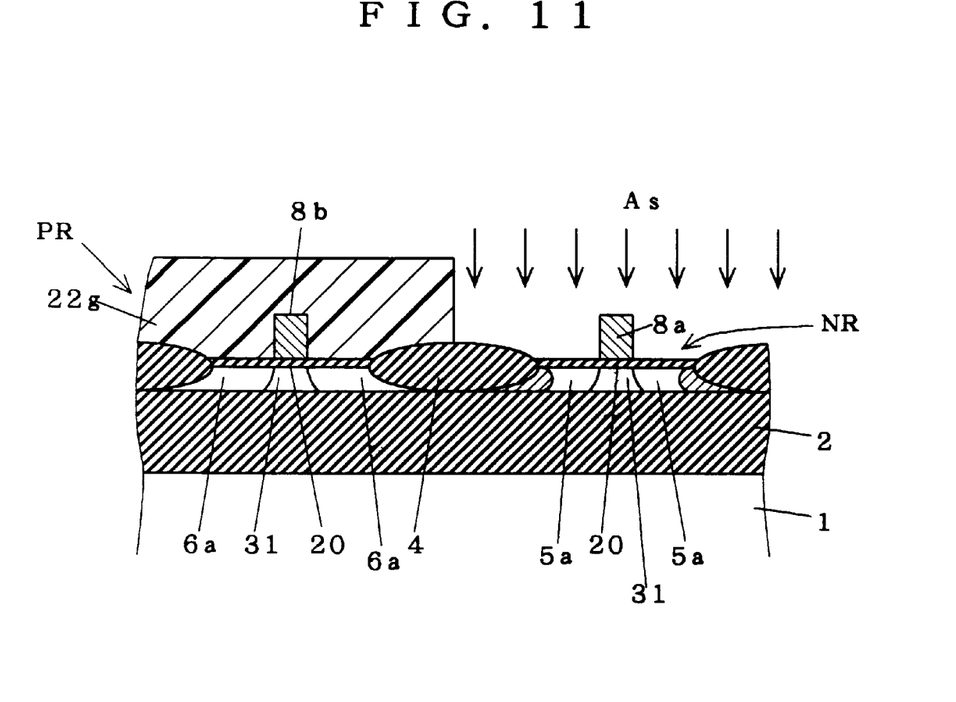

Next, with reference to FIG. 11, a resist 22g is formed on the PMOS region PR. With the resist 22g and the gate electrode 8a as masks, ion implantation into the NMOS region NR is performed to form LDD layers 5a in the channel doped layer 31.

In this ion implantation, arsenic ions are, for example, implanted at a dose of $0.1 \times 10^{12}$ to $10 \times 10^{12}/\text{cm}^2$ at an energy of 5 to 20 keV.

After this implantation, annealing may be performed for a several minutes (about 2 to 5 minutes) at a temperature of 750 to 850° C. in order to recover crystalline.

Figure 12:
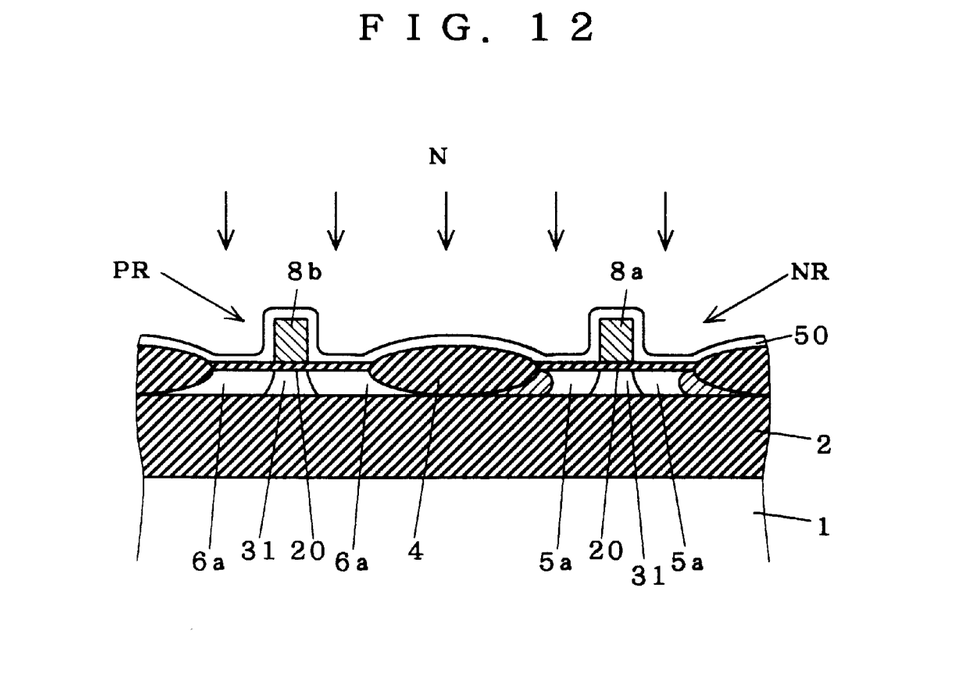
Figure 13:
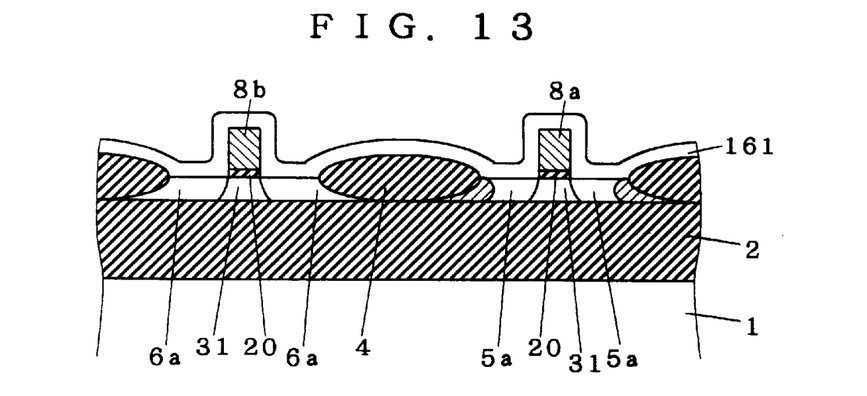

Next, with reference to FIG. 12, an oxide film 50 with a thickness of about 50 to 200 angstrom is formed in the upper portion of the NMOS and the PMOS regions NR, PR.

After that, nitrogen ions are implanted into the LDD layers 5a and 5b of the NMOS and the PMOS regions NR, PR, at a dose of $0.1 \times 10^{12}$ to $10 \times 10^{12}/\text{cm}^2$ at an energy of 5 to 20 keV.

<1-4. First Effect of Nitrogen Ion Implantation through Oxide Film>

The object of nitrogen ion implantation into the LDD layers 5a and 6a is to prevent deterioration in transistor characteristics by trapping nitrogen in crystal defects caused by impurity ion implantation. The reason why nitrogen ion implantation is performed through the oxide film 50 is that it prevents deterioration in crystalline in the channel doped layer 31. That is, nitrogen ion implantation is performed in order to prevent deterioration in and make improvement in transistor characteristics. In some cases, however, nitrogen ion implantation itself may cause deterioration in crystalline in the channel doped layer 31. Though crystalline is recovered by annealing in such cases, severe damage on crystalline due to too much implantation would not be sufficiently recovered.

When nitrogen ions are implanted through an oxide film, however, deterioration in crystalline due to the implantation is relieved, thereby increasing the effect of annealing on recovery of crystalline.

Further, though nitrogen ions are implanted simultaneously into the LDD layers 5a and 6a as shown in FIG. 12, the ion implantation may be separately performed. In such case, it is possible to independently provide implant conditions, so nitrogen ion implantation into the NMOS and the PMOS regions NR, PR can be performed under optimum conditions, respectively.

For example, the optimum dose for the LDD layers 5a (i.e., source/drain layers) of the NMOS transistor ranges from $1 \times 10^{12}$ to $5 \times 10^{12}/\text{cm}^2$ while that for the LDD layers 6a (i.e., source/drain layers) of the PMOS transistor ranges from $5 \times 10^{12}$ to $10 \times 10^{12}/\text{cm}^2$. The implant energy in each case is about 20 keV.

Now, getting back to the manufacturing process continued from FIG. 12, after the whole oxide film 50, and the gate oxide film 20 except portions directly under the gate electrodes 8a and 8b are removed, an oxide film 161 with a thickness of about 1000 to 2000 angstrom is formed in the upper portion of the NMOS and the PMOS regions NR, PR. This oxide film 161 may be formed of a TEOS oxide film made from TEOS (tetraethyl orthosilicate). Alternatively, the oxide film 161 may be formed without removing the gate oxide film 20.

Figure 14:
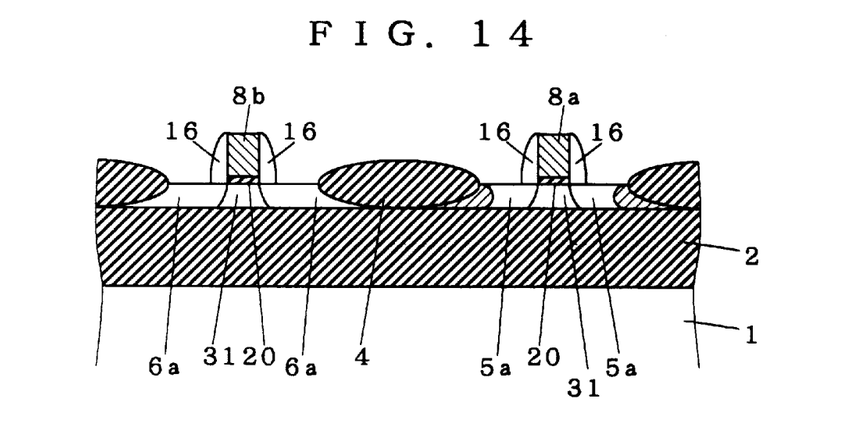

Then, anisotropic etching to the oxide film 161 provides sidewall oxide films 16 as shown in FIG. 14, leaving the oxide film 161 only at the side surfaces of the gate electrodes 8a, 8b and respective gate oxide films 20.

Figure 15:
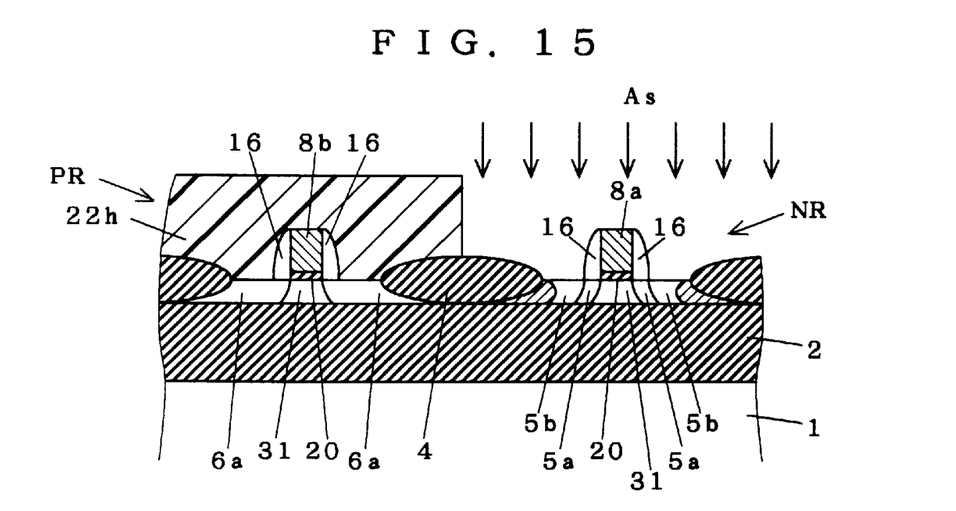

Next, with reference to FIG. 15, a resist 22h is formed on the PMOS region PR. With the resist 22h, the gate electrode 8a and the sidewall oxide films 16 as masks, source/drain layers 5b are formed in the channel doped layer 31 by ion implantation into the NMOS region NR.

In this ion implantation, arsenic ions are, for example, implanted at a dose of $1 \times 10^{14}$ to $50 \times 10^{14}/\text{cm}^2$ at an energy of 5 to 20 keV.

Figure 16:
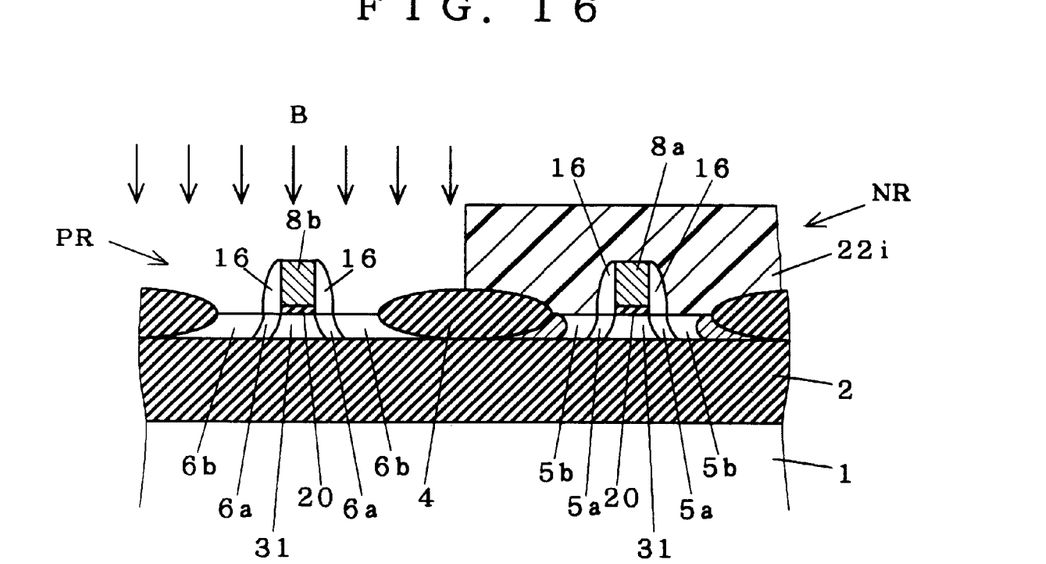

After the resist 22h is removed, a resist 22i is formed on the NMOS region NR as shown in FIG. 16. With the resist 22i, the gate electrode 8b and the sidewall oxide films 16 as masks, source/drain layers 6b are formed in the channel doped layers 31 by ion implantation into the PMOS region PR.

In this ion implantation, boron ions are, for example, implanted at a dose of $1\times10^{14}$ to $50\times10^{14}/cm^2$ at an energy of 5 to 20 keV.

After that, interlayer insulation films 60 are formed on the NMOS and the PMOS regions NR, PR. Then, contact holes CH are formed so as to reach to the source/drain layers 5b and 6b from the main surfaces of the interlayer insulation films 60, respectively. Finally, wiring layers HL are formed of metal compounds such as aluminum compound in the contact holes CH to complete the NMOS and the PMOS transistors 14 and 15 as shown in FIG. 17.

Figure 18:
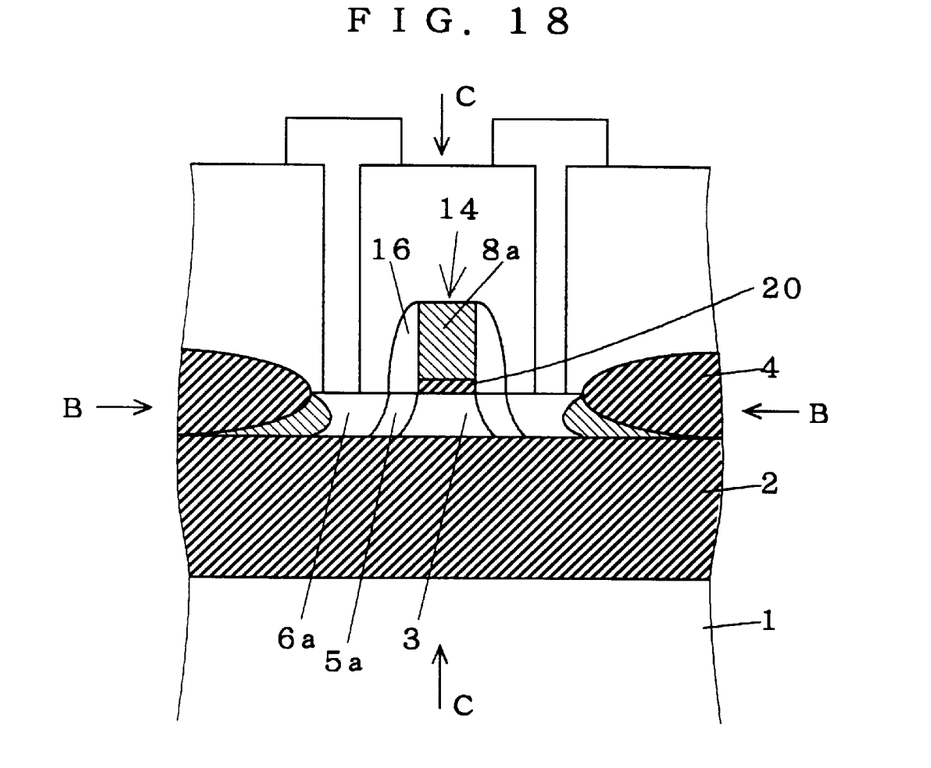
FIG. 18 is a partly sectional view showing a structure of the semiconductor device in accordance with the preferred embodiment of the present invention.
Figure 19:
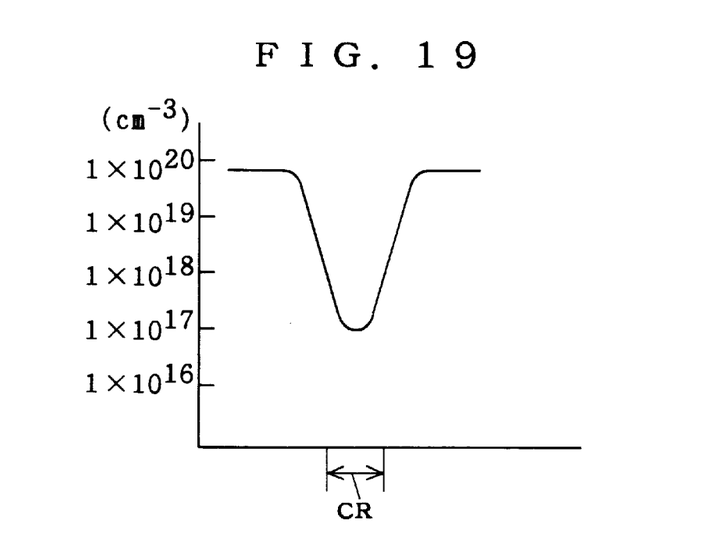
FIG. 19 is a graph illustrating concentration distribution of nitrogen in the semiconductor device in a horizontal sectional direction in accordance with the preferred embodiment of the present invention.
Figure 20:
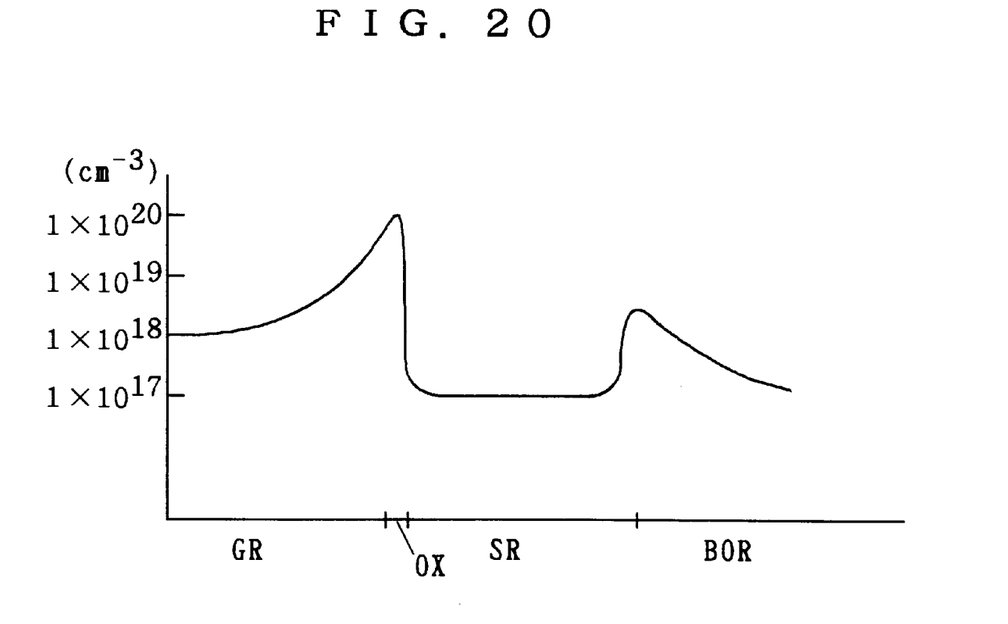
FIGS. 20 and 21 are graph illustrating concentration distribution of nitrogen in the semiconductor device in a vertical sectional direction in accordance with the preferred embodiments of the present invention.

FIG. 18 shows the structure of the NMOS transistor 14. FIGS. 19 and 20 show concentration distribution of nitrogen in a sectional direction taken along the lines B—B, and C—C of FIG. 18, respectively.

In FIG. 19, the horizontal axes represents a position taken along the line B—B, and the vertical axes represents nitrogen concentration ($cm^{-3}$). As shown in FIG. 19, nitrogen concentration in the channel doped layer 31 positioned under the gate electrode 8a (i.e., channel regions CR) is about $1\times10^{17}/cm^3$ while that in the source/drain layers 5b ranges from $1\times10^{19}$ to $1\times10^{20}/cm^3$.

In FIG. 20, the vertical axes represents nitrogen concentration ($cm^{-3}$), and the horizontal axes represents a position taken along the line C—C (i.e., position in the depth direction). Reference characters GR, OX, SR and BOR represent a gate region, a gate oxide film region, a SOI region, and a buried oxide film region, respectively, from the left.

As shown in FIG. 20, in the SOI region SR, nitrogen concentration in the vicinity of the gate oxide film region OX is about $1\times10^{20}/cm^3$ and that in the vicinity of the buried oxide film region BOR is about $1\times10^{19}/cm^3$, both of which are prominent among nitrogen concentration in the other regions (about $1\times10^{17}/cm^3$). This clearly explains, as previously described, that nitrogen is segregated in the interfaces between the channel doped layer 31 and the buried oxide film 2 (first interface) and between the channel doped layer 31 and the gate oxide film 20 (second interface).

Further, in FIG. 20, nitrogen is uniformly distributed in the SOI region SR except in the edge portions thereof. The implanted nitrogen ions, however, may not be uniformly diffused depending on the conditions of thermal treatment after the nitrogen ion implantation. Such state is shown in FIG. 21.

Figure 21:
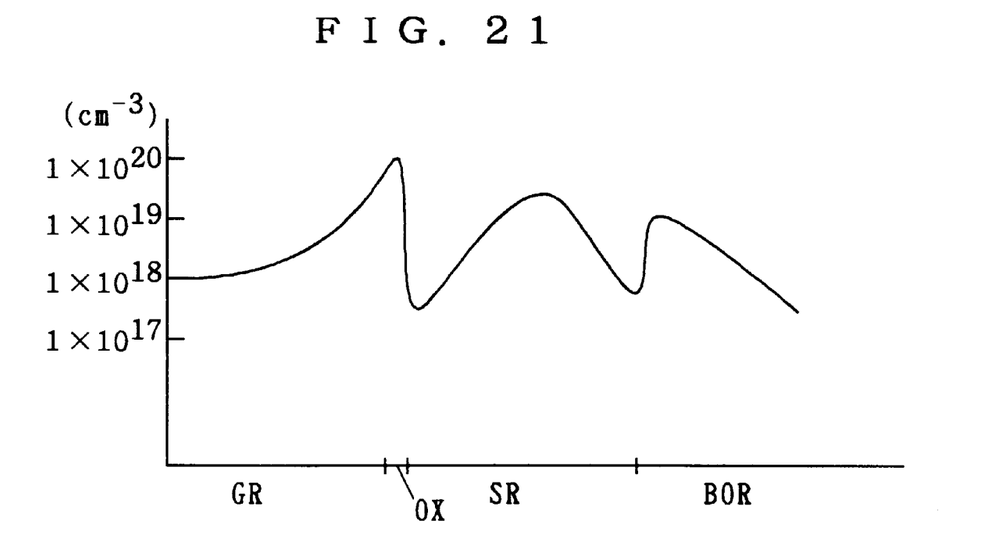

In FIG. 21, concentration distribution of nitrogen has one of peaks in the center portion of the SOI region SR. Though the nitrogen ions are implanted so as to have a peak of its concentration near the center portion of the SOI layer 3 and are diffused by thermal treatment, if the thermal treatment are performed under undesirable conditions such as low temperature or short period, the peak remains in the center portion of the channel doped layer 31.

In such case that nitrogen concentration is high in the center portion of the channel doped layer 31, if nitrogen is segregated in the first and the second interfaces, however, it is possible to prevent deterioration in and make improvement in transistor characteristics.

<1-5. Second Effect of Nitrogen Ion Implantation through Oxide Film>

The following description gives another effect of nitrogen ion implantation into the LDD layers 5a and 6a through the oxide film 50, in addition to prevention of deterioration in crystalline of the channel doped layer 31 described above with reference to FIG. 12.

Figure 22:
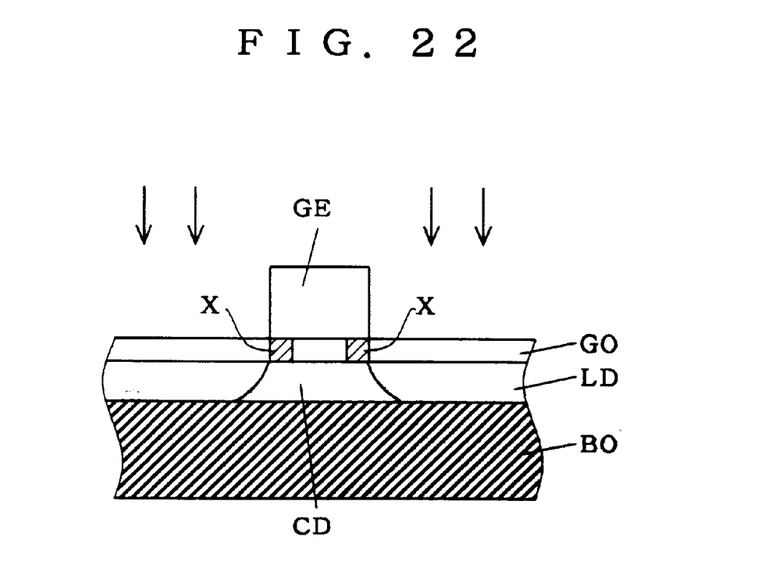
FIG. 22 is a sectional view showing a process of nitrogen ion implantation into LDD layers through no oxide film.

FIG. 22 is a partly sectional view in implanting impurity ions with no oxide film 50 on the upper portions of the NMOS and PMOS regions NR, PR.

As shown in FIG. 22, a channel doped layer CD where impurity ions are implanted in the SOI layer, gate oxide films GO and a gate electrode GE are formed one above the other on the upper portion of the buried oxide film BO. With the gate electrode GE as a mask, nitrogen ions are implanted into LDD layers LD in the channel doped layer CD. Nitrogen ion implantation into such structure is likely to reduce reliability in the gate oxide film GO, depending on its dose.

More specifically, regions (shown by X in the figure) in the vicinity of the edge end portion of the gate electrode GE in the gate oxide films GO may be damaged by nitrogen ion implantation, thereby suffering deterioration in electrical insulation of the gate oxide film GO. Further, though entirely damaged, the gate oxide film GO except a portion under the gate oxide electrode GE will be removed. Thus, the damage is not worth of considering.

Further, covering the gate electrode with the oxide film protects the gate oxide film GO in the vicinity of the gate electrode GE, which would not cause any damage to the region X.

As described above and shown in FIG. 12, nitrogen ion implantation into the LDD layers 5a and 6a performed through the oxide film 50 prevents damage to the gate oxide film 20 due to implantation, and further prevents deterioration in reliability of the gate oxide film 20.

<2. Modification>

In the above-described preferred embodiment, annealing is performed in order to diffuse nitrogen ions after nitrogen ions are implanted into a channel doped layer as shown in FIGS. 6 and 7. Alternatively, the nitrogen ions may be diffused by making use of gate oxidation performed after nitrogen ion implantation into the channel doped layer.

More specifically, if gate oxidation is performed by thermal oxidation, the channel doped layer 31 is heated as well, thereby diffusing implanted nitrogen ions. Further, though conditions necessary for the gate oxidation and that necessary for the diffusion of nitrogen ions have to meet with each other in this case, the present manufacturing process would make it possible.

Further, if all conditions are met, the annealing described above may also serve as other heating process, which may not be gate oxidation process, such as annealing after ion implantation to form LDD layers, if it fits all the conditions.

Furthermore, though a MOSFET is used as an example of semiconductor devices formed on the SOI substrate in the preferred embodiments and modification of the present invention, the effect is not limited only to the MOSFET. The same effect of the present invention would be available in any semiconductor devices formed on the SOI substrate and having a possibility that an implanted impurity may be trapped by dangling bonds.

While the invention has been described in detail, the foregoing description is in all aspects illustrative and not restrictive. It is understood that numerous other modifications and variations can be devised without departing from the scope of the invention.

We claim:

1. A semiconductor device formed on a SOI substrate in which a buried oxide film and a SOI layer are stacked on a silicon substrate, said semiconductor device comprising:

a first semiconductor region of a first conductivity type formed in a predetermined position of said SOI layer, said first semiconductor region extending from a surface of said SOI layer to a surface of said buried oxide film;

a pair of second semiconductor regions of a second conductivity type selectively formed in said SOI layer so as to sandwich said first semiconductor region;

a gate oxide film formed in an upper portion of said first semiconductor region; and a gate electrode formed on said gate oxide film, wherein said first semiconductor region contains nitrogen introduced so as to have a predetermined concentration distribution in a depth direction thereof, said predetermined concentration distribution having:

a first peak portion having a first concentration range, in the vicinity of an interface between said first semiconductor region and said buried oxide film; and a second peak portion having a second concentration range, in the vicinity of an interface between said first semiconductor region and said gate oxide film.

2. The semiconductor device according to claim 1, wherein said predetermined concentration distribution has a plane portion of substantially uniform concentration having a third concentration range lower than said first and said second concentrations ranges, in a region between said first and said second peak portions.

3. The semiconductor device according to claim 2, wherein said first concentration range is from $1 \times 10^{18}$ to $1 \times 10^{19}/cm^3$;

said second concentration range is from $1 \times 10^{19}$ to $1 \times 10^{20}/cm^3$; and said third concentration range is from $1 \times 10^{16}$ to $1 \times 10^{17}/cm^3$.

4. The semiconductor device according to claim 1, wherein said predetermined concentration distribution has a third peak portion having a third concentration range which is at least lower than said second concentration range, near a center of a region between said first and said second peak portions.

5. The semiconductor device according to claim 4, wherein said first concentration range is from $1 \times 10^{18}$ to $1 \times 10^{19}/cm^3$;

said second concentration range is from $1 \times 10^{19}$ to $1 \times 10^{20}/cm^3$; and said third concentration range is from $1 \times 10^{18}$ to $5 \times 10^{19}/cm^3$.

6. The semiconductor device according to claim 1, wherein said second semiconductor region contains nitrogen introduced so as to have nearly a same concentration as said second concentration.

* * * * *